United States Patent [19]

Aurand

[11] 4,363,000
[45] Dec. 7, 1982

[54] POWER AMPLIFIER TANK CIRCUIT

[75] Inventor: James A. Aurand, Quincy, Ill.

[73] Assignee: Broadcast Electronics, Inc., Quincy, Ill.

[21] Appl. No.: 138,669

[22] Filed: Apr. 9, 1980

[51] Int. Cl.³ .......................... H03F 3/60; H01P 7/04
[52] U.S. Cl. .................................... 330/56; 333/226
[58] Field of Search ................... 333/226; 331/97-98, 331/101-102; 330/56

[56] References Cited

U.S. PATENT DOCUMENTS 2,421,784  6/1947  Haeseler et al. ...................... 330/56
3,452,293  6/1969  De Long et al. ...................... 330/56

Primary Examiner—James B. Mullins
Assistant Examiner—Gene Wan
Attorney, Agent, or Firm—Hill, Van Santen, Steadman, Chiara & Simpson

[57] ABSTRACT

An RF tank circuit for a transmitter power amplifier stage including a half-wave length "folded" coaxial transmission line as an anode tuning device. The tank circuit has a grounded outer conductor and an ungrounded inner conductor, the latter to be operated at a high RF potential. The outer conductor is connected electrically to a third conductor which is adjustably extensible into the ungrounded inner conductor, hence, suggesting a folded effect for the outer conductor and the third conductor in combination. The third conductor has a bellows which can be expanded or contracted by drive means disposed exteriorly of the cavity, thereby to fine-tune the cavity to a selected frequency. The third conductor has mounting means which permit its extension into the inner conductor to be variable, thus allowing for coarse adjustment of the bandwidth, prior to the fine-tuning accomplished by suitable bellows-drive controls.

4 Claims, 6 Drawing Figures

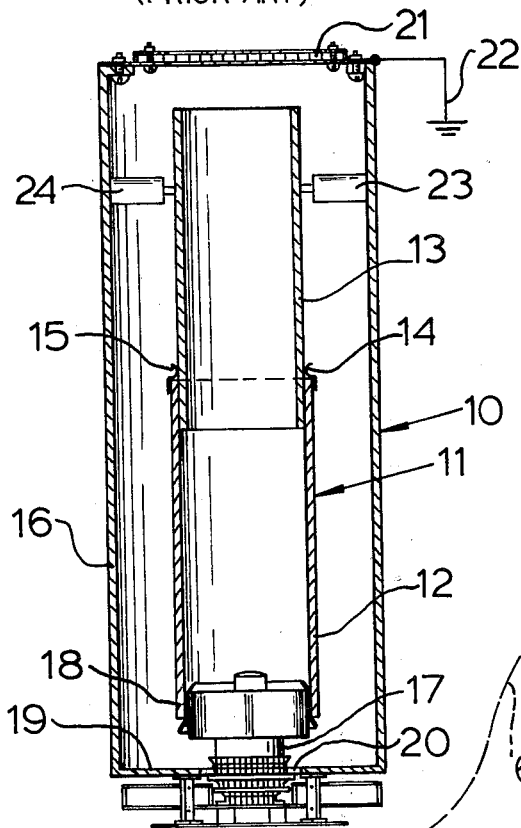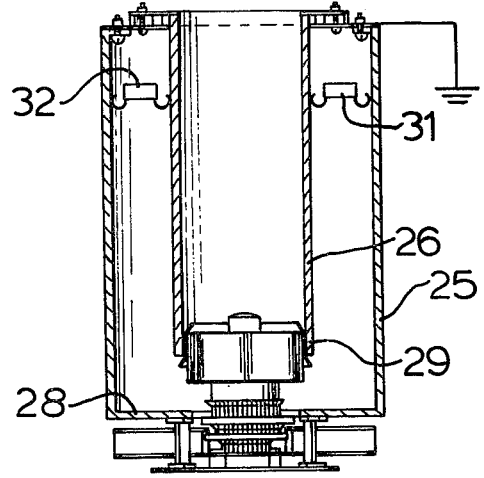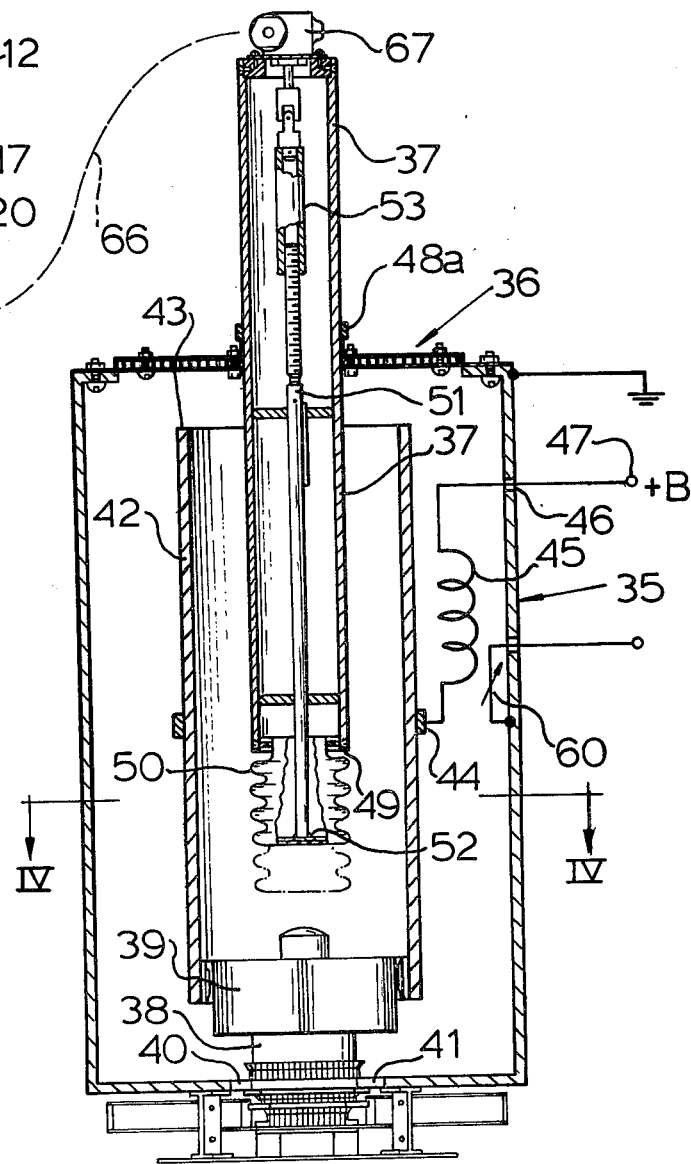

POWER AMPLIFIER TANK CIRCUIT

BACKGROUND OF THE INVENTION

1. Description of the Prior Art

Resonant transmission lines, also commonly referred to as RF tank cavities or RF tank circuits have been built in the past in half-wave and quarter-wave types. These circuits usually require a plate blocking capacitor to insulate the high DC potential of an associated power amplifier anode from the cavity walls, and in addition, they require insulated mechanical sliding supports for tuning. Both the half-wave and quarter-wave cavities built along these principals are more costly and have less efficiency than the folded half-wave cavity which is the subject of the present invention. Due to the folded nature of this cavity, a plate blocking capacitor is not required, and the inner conductor of the cavity may be operated at a high DC as well as a high RF potential, since tuning is accomplished without contact whatsoever with this inner conductor.

2. Field of the Invention

The field of art to which this invention pertains is RF tank circuits for amplifier stages and, in particular, to such circuits for use with power transmitters. More particularly, this invention relates to the manner of forming the tank circuit in such a way as to improve the power and efficiency as well as to effect cost reductions in the unit.

SUMMARY OF THE INVENTION

It is an important feature of the present invention to provide a resonant transmission line or an RF tank circuit for a transmitter power amplifier stage.

It is another feature of the present invention to provide an RF tank circuit for a power amplifier stage with increased efficiency and having mechanical simplifications for cost reductions.

It is a principal object of this invention to provide a folded half-wave cavity as an RF tank circuit for a power amplifier stage of a transmitter.

It is also an object of the present invention to provide an RF tank circuit for a power amplifier stage wherein the half-wave cavity is folded into itself, such that tuning of the cavity can be accomplished without mechanical supports at points of high RF potential.

It is another object of the invention to provide an RF tank circuit as described above wherein a portion of the grounded segment of the cavity is folded into an ungrounded segment and has an adjustable tuning berrilium copper bellow which may be adjusted from a drive means outside the cavity to accomplish fine tuning.

These and other features, objects and advantages of the present invention will be understood in greater detail from the following drawings and associated descriptions wherein reference numerals illustrate a preferred embodiment.

DESCRIPTION OF THE DRAWINGS

FIG. 1 is a sectional view of a half-wave cavity using mechanical supports to adjust the transmission line and having sliding contacts between the movable sections of that line.

FIG. 2 is another prior art device which is a quarter-wave length cavity also using sliding plate tuning contacts for tuning the cavity to a desired frequency. Both the devices in FIGS. 1 and 2 have plate blocking capacitors to insulate the high voltage of the RF amplifier tube from the walls of the transmission line.

FIG. 3 is a sectional view of a folded half-wave cavity in accordance with the present invention which employs means for tuning the cavity without the use of sliding contacts. This cavity eliminates the necessity for a plate blocking capacitor since the section of the transmission line which is in contact with the anode of the tube has no sliding contacts and, in fact, is physically spaced from the external walls of the cavity.

DESCRIPTION OF THE PREFERRED EMBODIMENT

Figure 6:
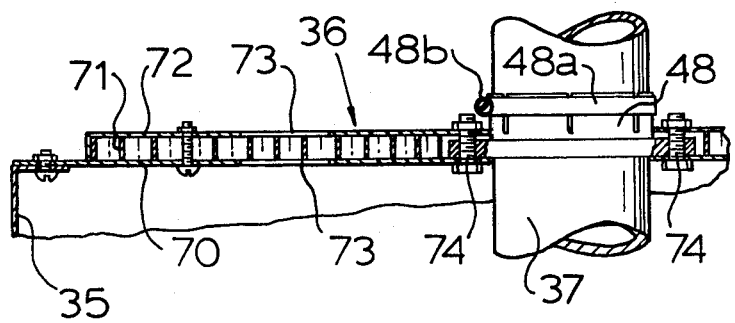
FIG. 6 is a detailed view of the top of the folded half-wave cavity, showing the mounting means for coarse adjustment of the third conductor.

The present invention relates to a resonant transmission line or half-wave cavity for a power transmitter. The cavity of the present invention is simplified over the prior art, allows cost reductions and has increased efficiency for the power amplifier stage of a transmitter. All this is accomplished by an arrangement wherein the outer conductor is folded into itself such that the inwardly folded section, for a portion of the length of the cavity, is positioned axially centrally of the inner conductor. The inner conductor is mechanically and electrically coupled directly to the anode of the RF amplifier tube, and hence, is maintained at the same DC potential as the anode. This is possible since there are no contacts between this inner conductor and the external portions of the cavity.

The folded portion of the cavity extends axially inside the inner conductor and is in the form of a hollow sleeve which is affixed to a honeycomb structure vent at the uppermost edge of the outer conductor. The end of the hollow sleeve has a berrilium copper bellows which is expandable by a drive mechanism which extends axially within the sleeve. Berrilium copper has a high conductivity and a long-term flex rate and therefore is particularly suitable for such a bellows. By adjusting the bellows, the tune frequency may be adjusted within a 2 MHz bandwidth. Coarse frequency adjustment is accomplished by presetting the position at which the hollow sleeve mounts to the honeycomb structure at the top of the cavity. The sleeve may be coarse-adjusted by loosening a hose clamp and then resetting the sleeve to a desired position for the frequency of operation. This, together with the tuning available by the bellows, covers the entire FM broadcast band.

Prior to the present invention, many resonant transmission lines or cavities have been of the standard half-wave variety or of the quarter-wave length variety. In either case, the cavities have required sliding mechanical contacts at high RF potentials or currents in order to accomplish tuning. In addition, to assure that the sliding contacts were not at a high DC potential, the RF amplifier tube usually had a plate-blocking capacitor located between the anode of the tube and the transmission line which was affixed thereto. These designs (now being used) have comparatively less efficiency and considerably more complexity and more opportunity for failure than the device of the present invention. For example, in the prior art, the cavity was usually silver-plated to assure good contact with the sliding contacts. This is not needed in the device of the present invention.

Referring to the drawings in greater detail, the prior art device of FIG. 1 consists of an outer conductor 10 and an inner conductor 11. The inner conductor 11 has slidable sections 12 and 13. Section 13 is sleeve-like and fits inside the section 12. The device also has sliding plate tuning contacts as illustrated by numerals 14 and 15.

The inner conductor 11 is mounted to a cooling fin 16 for the anode of the RF amplifier tube 17. A plate blocking capacitor 18 is positioned between the anode fins and the inner surface of the inner conductor 11. This acts as a DC block for the high voltage associated with the plate of the RF amplifier tube; this voltage may be in the order of 10 KV. The plate-blocking capacitor is an expensive item and has been known to present reliability problems. A lower plate 19 as air spaces such as at 20 to allow for air cooling of the RF amplifier tube. The air is allowed to exit through a honeycomb-type structure at the top surface 21 of the cavity. The cavity is grounded externally as shown schematically at 22. In the case of FIG. 1 the cavity is tuned by using mechanical supports such as illustrated at 23 and 24. These supports may be in a variety of forms, however, they grasp the slidable section 13 of the inner conductor and by mechanical means which may extend through the wall of the outer conductor, they may be moved vertically up and down causing the section 13 to slide within the section 12, thereby changing the length of the cavity and adjusting the frequency of tuning.

The prior art structure shown in FIG. 2 is a quarter-wave length cavity having an outer conductor 25 and an inner conductor 26. The inner conductor 26 is mounted to the cooling fins 27 associated with the anode of an RF amplifier tube 28 but insulated therefrom by a blocking capacitor 29 such that the inner conductor 26 is not maintained at a high DC potential. The upper ends of the conductor are connected to a similar honeycomb structure 30, which allows for the free flow of cooling air through the cavity.

In this case, there is also a doughnut-shaped sliding plate tuning contact illustrated at 31. This contact may be connected to points exterior of the outer conductor 25, so that it may be moved up and down between the inner conductor and the outer conductor and thereby effect tuning of the device. As in the case of FIG. 1 increased complexity of the mechanical structure, plating, reduced efficiency and also the need for a blocking capacitor characterize this product.

Figure 4:
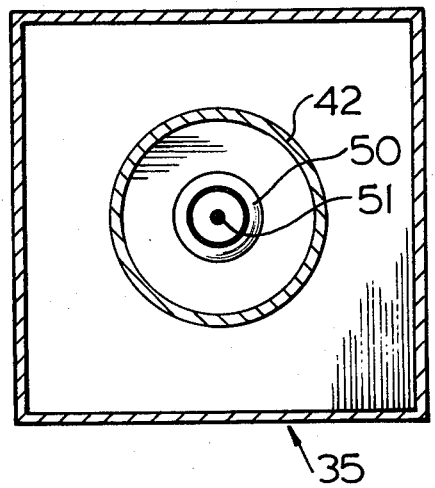
FIG. 4 is a cross-section of the device of FIG. 3 taken along the lines IV—IV.

FIGS. 3 and 4 show the device of the present invention which eliminates the above-mentioned disadvantages of the device of FIGS. 1 and 2. This device may be referred to as a folded half-wave cavity. It has an outer conductor 35 which is "in effect" folded. The outer conductor 35 electrically is connected to a honeycomb upper portion of the cavity shown at 36 which, in turn, is mounted to a hollow sleeve 37 which extends inside the cavity. This honeycomb structure and the mounting means for the sleeve 37 are shown in more detail in FIG. 6.

An amplifier tube 38, has copper or similar heat conducting fins 39 at its anode. By way of example, this may be a ceramic/metal power tetrode with an anode rated for 20 KW of dissipation such as an Eimac 8990/4CX20000A. Space for air flow is shown at 40 and 41 allowing cooling air to pass around the tube and through the honeycomb structure 36 at the top of the cavity. The cooling fins have an inner conductor 42 attached thereto. The inner conductor extends upwardly within the cavity to its top surface 43 which is spaced from the honeycomb structure 36. This inner conductor is removably connected by suitable contacts to the fins of the amplifier tube and therefore maintained at the same voltage as the anode. The high voltage DC is applied directly to the inner conductor at a point 44 which is at an RF voltage null point. The high voltage DC is applied through a coil 45 which has a lead passing through a feed thru capacitor 46 formed in the wall of the outer conductor 35. The connection of the high voltage to this line is shown as B+ at a circuit point 47.

The hollow sleeve 37 which in effect is the outer conductor folded into itself is mounted through a sleeve bracket 48, and it extends to a lower surface 49 inside the inner conductor 42. Coarse-tuning may be accomplished by loosening a hose clamp 48a by turning a screw 48b which, in effect, allows the degree of extension of the sleeve 37 inside the cavity to be adjusted.

Fine tuning is accomplished by the use of a berrilium copper bellows 50 which is affixed to the lower end of the sleeve 37. In the preferred embodiment herein a Robertshaw Controls Company "sylphon" bellows was used, which yielded a fine tuning bandwidth of approximately 2 MHz. Berrilium copper was selected for its high conductivity and long-term flex rate. The actual adjustment of the bellows is mechanically accomplished by means of a drive shaft 51 which extends inside the sleeve 37, as described further in connection with FIG. 5. The RF output is taken from the cavity through a coaxial line 60 which couples RF energy from the RF voltage null point.

Figure 5:
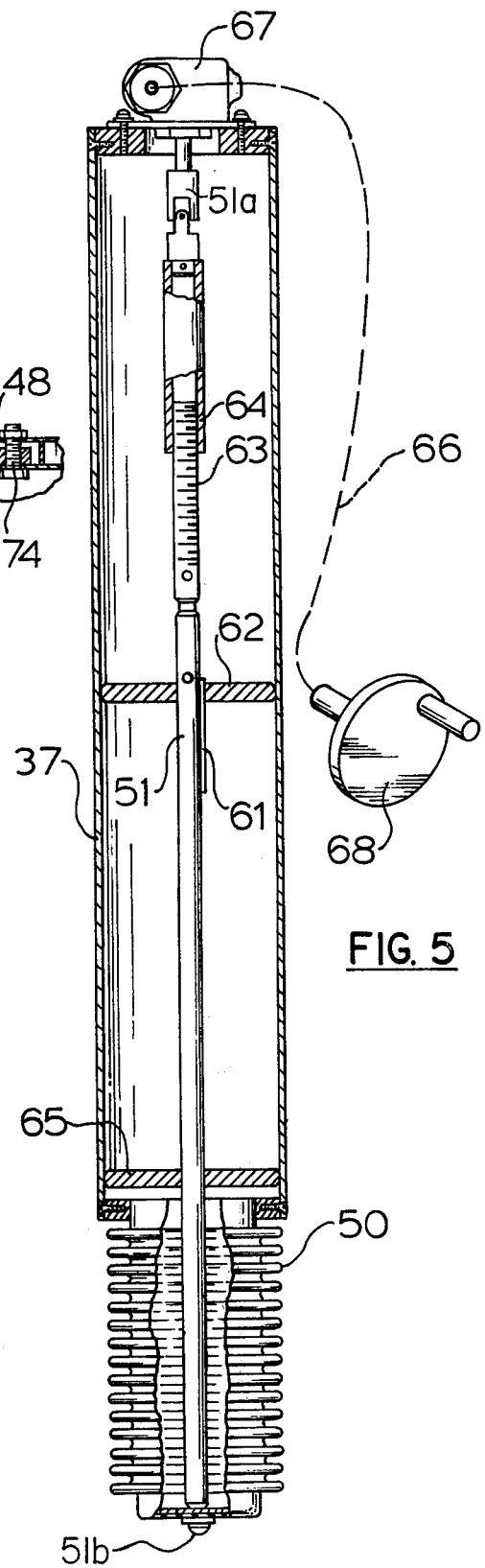
FIG. 5 is a detailed view of the third conductor, illustrating the mechanical means for adjusting a bellows at its lower end.

FIG. 5 is a detail of the sleeve 37. The drive shaft 51 is connected to the lower end 52 of the bellows by a screw 51b. It is slidably held by a key 61 mounted in a keyway in a shaft guide 62. The shaft is threaded at 63 and is threaded into a sleeve 64. As the sleeve 64 is rotated, the shaft 51 is moved up or down, sliding within the keyway and within a lower guide 65. This causes the bellows 50 to compress or expand, respectively. The sleeve is rotated by rotating a flexible shaft 66 into a gear drive box 67, which may have a gear reduction to a rotating shaft 51a, which in turn is coupled, as shown, to rotate the sleeve 64. A suitable manual means 68 may be used to rotate the flexible cable 66, and hence, compress or expand the bellows, thereby accomplishing fine tuning of the cavity.

The honeycomb structure 36 as shown in FIG. 6 comprises a sandwich of a bottom plate 70, a honeycomb layer 71 and a top plate 72. The bottom and top plates have large holes 73 to permit air to flow through the structure 36. The bracket 48 is clamped between the plates 70 and 72 by bolts 74. As described above, a hose clamp 48a may be loosened to allow the sleeve 37 to be moved up or down for coarse tuning. When the proper position is found, the hose clamp is reset and then the bellows 50 is adjusted for fine tuning.

It will be apparent to those skilled in the art, once having seen and understood the above description, that various modifications may be accomplished without departing from the basic innovations which are described above and which are set forth in the following claims.

I claim as my invention:
1. A resonant transmission line comprising:

outer and inner conductors, a third conductor positioned generally axially within said inner conductor and electrically connected to said outer conductor, said inner conductor having a power amplifier tube mounted in one end thereof in direct contact therewith and having an open opposite end through which said third conductor extends a distance into said inner conductor, a conductive bellows disposed at an end of said third conductor which is inside said inner conductor, drive means extending through said third conductor connected to said bellows for axially expanding and contracting said bellows for fine-tuning said transmission line, drive controls located outside said inner conductor drivingly connected to said drive means for operating said drive means to fine-tune said cavity, the anode of said power amplifier tube being electrically connected directly to said inner conductor and, a coarse adjustment means mechanically connecting said third conductor and said outer conductor for coarse-tuning of said transmission line, said coarse adjustment means permitting limited axial movement of said third conductor inside said inner conductor.

2. The resonant transmission line of claim 1 wherein said coarse adjustment means comprises a hose clamp rigidly affixed to said outer conductor and receiving said third conductor therein, said hose clamp having a tightenable band for permitting axial movement of said third conductor through said hose clamp when said band is loosened and for fixing the position of said third conductor when said band is tightened.

3. The resonant transmission line of claim 1 wherein said drive means comprises:

a drive shaft having a first end connected to said bellows and an opposite second end which is threaded, a threaded sleeve receiving said threaded end of said drive shaft, said sleeve being connected to said drive controls for rotating said sleeve, and a means for preventing rotation of said drive shaft, whereby operation of said drive controls rotates said sleeve for selectively changing the extent of axial engagement of said threaded end of said drive shaft in said sleeve thereby axially moving said drive shaft.

4. The resonant transmission line of claim 3 wherein said means for preventing rotation of said drive shaft comprises:

a key carried on said drive shaft, and a shaft guide mounted in said third conductor through which said drive shaft extends, said shaft guide having a keyway for receiving said key.

* * * * *